June 24, 1969 E. A. TAFT, JR., ET AL 3,451,867

PROCESSES OF EPITAXIAL DEPOSITION OR DIFFUSION EMPLOYING A SILICON CARBIDE MASKING LAYER

Filed May 31, 1966

Inventors:
Ernest A. Taft,
Peter V. Gray,
by Edward D. Murphy
Their Attorney.

United States Patent Office
3,451,867
Patented June 24, 1969

3,451,867

PROCESSES OF EPITAXIAL DEPOSITION OR DIFFUSION EMPLOYING A SILICON CARBIDE MASKING LAYER

Ernest A. Taft, Jr., Schenectady, and Peter V. Gray, Scotia, N.Y., assignors to General Electric Company, a corporation of New York Filed May 31, 1966, Ser. No. 554,021
Int. Cl. H01l 7/44, 7/36; B44d 1/52
U.S. Cl. 148—175 12 Claims This invention relates to an improved method for producing planar semiconductive devices and to the devices produced thereby.

Conventional methods of making planar semiconductive devices include the steps of masking a generally planar surface of a semiconductive silicon wafer by providing an oxide of silicon on selected regions and converting a surface-adjacent portion of the exposed silicon to a different conductivity type from that of the remainder of the wafer to produce a junction. This process may be repeated to produce multijunction devices. It has been found in performing this process that, although the oxide functions as a suitable diffusion mask to prevent diffusion of certain impurities, notably boron and phosphrous, into covered regions of the semiconductive wafer, other diffusants which would be useful in the fabrication of devices having different characteristics either are not sufficiently masked by the oxide or are incompatible with it. Therefore, the region under the oxide may be converted or the oxide may be destroyed and the desired device cannot be made. It is accordingly of interest to provide a method of masking semiconductive bodies which permits a wider selection of impurities to be used in preparing layers of differing conductivity, and a correspondingly wider range of available planar devices. It is also of interest, in connection with epitaxial deposition of regions of differing conductivity, to provide a mask which can withstand the high temperatures required, for example, in iodine epitaxy so that the advantages of epitaxial layers can be achieved in planar devices.

It is accordingly an object of this invention to provide an improved method of preparing semiconductive devices which overcomes the above-mentioned difficulties.

Another object of this invention is the provision of an improved method of producing planar semiconductive devices which permits the fabrication of a large variety of planar devices.

A further object of this invention is the provision of a method of preparing semiconductive planar devices which permits selection of a wide variety of conductivity determining impurities.

It is also an object of this invention to provide a new and improved method of preparing semiconductive devices which permits high temperature deposition on selected regions.

Another object of this invention is the provision of a new and improved class of semiconductive devices.

A further object of this invention is the provision of a new and improved mask for use in the production of planar devices.

It is also an object to provide a novel method of preparing a mask for the production of planar devices.

Briefly, in accord with one embodiment of this invention, we provide an improved method of producing planar semiconductive devices which comprises the steps of forming a layer of silicon carbide over selected areas of one surface of a silicon wafer and producing a region of different conductivity adjacent the surface areas not covered by silicon carbide. This may be done, in accord with a preferred aspect of our invention, by introducing a conductivity-determining impurity into the surface-adjacent areas by diffusion. In accord with another aspect of our invention, this may be done by depositing such a region on such an area, for example, epitaxially. As a further feature of our invention, the novel devices have at least a partial passivating layer of silicon carbide.

The novel features believed characteristic of the invention are set forth in the appended claims. The invention itself, together with further objects and advantages thereof may best be understood by reference to the following description taken in connection with the appended drawings in which:

FIGURES 4A and 4B represent a planar device in accord with this invention at two intermediate steps in the fabrication.

Figure 1:
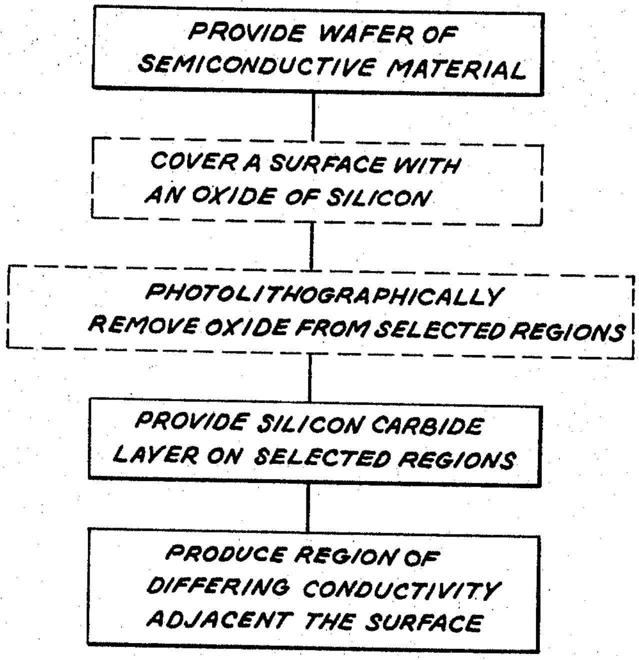
FIGURE 1 is a flow sheet outlining the process steps according to the method of the present invention.
Figure 1:
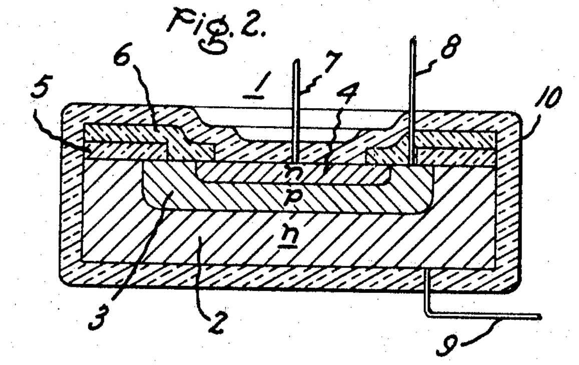

FIGURE 1 sets forth in outline form the succession steps of the method of the present invention. First, a wafer of semiconductive material, generally monocrystalline, is provided in which devices are to be fabricated. The following description is made in terms of silicon to which this invention is particularly suited, although other materials may also be used. In practice, this wafer may be 1 to 2 centimeters in diameter and approximately 0.5 millimeter thick, and 1,000 or more devices may be produced on one side. Next, a coating of silicon carbide, preferably on the order of 0.1 to 1 micron thick, is produced on the surface of the wafer so as to cover the areas of the silicon where diffusion is not desired. As indicated by the dotted boxes in FIGURE 1, this may, in accord with a preferred embodiment of this invention, comprise covering the wafer with an oxide of silicon, removing the oxide from selected regions by photolithographic techniques and then covering the exposed silicon with silicon carbide. A particular feature of this invention lies in the discovery that thermally grown silicon carbide is masked by the oxide so that the carbide can be grown on the exposed silicon regions of the surface but not on those regions covered by the oxide. Thus, by this method, a mask of silicon carbide of any desired configuration can be provided.

In more detail, the outlined steps include converting silicon to an oxide thereof by baking the silicon in an oxygen or steam atmosphere, typically at a temperature of 1,000° C. for several hours, to produce a layer about 0.1 micron thick. The photolithographic techniques of removing the oxide from silicon area comprise covering the entire oxide with a layer of photo-resistive material, exposing to light those areas which are to remain covered with oxide and removing the unexposed photoresist and underlying oxide. In accord with the present invention, the exposed surface is then covered with silicon carbide, for example, by heating the wafer in an atmosphere containing carbon monoxide or methane to a temperature in the range of 800° C. to 1,100° C. for a time in the range of 1 minute to 10 minutes depending on the thickness of the carbide required. Deposited oxide or carbide may alternatively be used if desired. In particular, where semiconductive materials other than silicon are used, silicon oxide and silicon carbide layers must be deposited.

To produce a junction device as indicated in the next step of FIGURE 1, a region having conductivity different, in number and/or in type, from the body of the wafer is now provided adjacent the surface area not covered by the carbide. This may be done by diffusion into or epitaxial deposition on the wafer. By using silicon carbide in accord with the present invention, several additional conductivity-determining impurities such as gallium and arsenic which cannot be masked by oxides of silicon in the conventional process may be selected for diffusion since the other areas are masked by the intervening layer of silicon carbide. For such diffusion, the wafer is heated in an atmosphere containing the desired impurity, the temperature and timing being dependent upon the diffusion rate and upon the desired device configuration but generally lying in the respective ranges of 1,000° C. to 1,250° C. and 10 minutes to 4 days. It is noted that the wafer may conveniently be left in the high temperature furnace where the carbide is prepared and the impurity-containing atmosphere may simply be substituted for the carbon-containing atmosphere, thus decreasing any possibility of contamination.

Alternatively, the silicon oxide may be removed, as well as part of the silicon if desired, and one or more regions of silicon of differing conductivity may be added by epitaxial deposition. A particular advantage of this invention in this case is that the silicon carbide can withstand high temperatures for longer times than the conventional oxide, thus permitting depositions which cannot be performed with the oxide mask.

The fabrication of particular devices may include repetition of some of the above steps to accomplish diffusion of additional impurities, either into exposed silicon areas, through the silicon oxide or through the carbide by using impurities which are not masked thereby. Also, additional epitaxial depositions may be performed. Conventional photolithographic techniques may be used to mask and remove suitable portions of the overlying layers as necessary. When the device is complete, the wafer is scribed and the various single devices are broken off and encapsulated in accord with conventional techniques. Either the wafer or the individual devices may be provided with a complete passivation layer by heating in an atmosphere containing a suitable compound of oxygen or carbon. Finally, small areas of the surface-emergent regions may be exposed for the attachment of electrodes thereto, either before or after breaking off the individual devices.

In further accord with the present invention we have discovered that the silicon carbide layer is a suitable passivation layer for the devices, the term "passivation" describing the functions of preventing surface contamination and electrical short circuits to overlying electrodes. In particular, the silicon carbide layer is improved over the conventional silicon oxide layer in that, for example, it is less permeable to impurities such as hydrogen and water which can diffuse through the oxide by virtue of the ready availability of oxygen to transfer the hydrogen through the layer. The carbide layer is therefore less subject to contamination. Also, it is noted that silicon carbide has a higher dielectric constant than the oxide.

Thus, the method of the present invention enables the production of devices of substantially greater variety than those previously possible by enabling the use of additional impurities. This allows substantially greater flexibility in the manufacturing process, since a wider range of selections are available from which to choose the best and most economical. Devices having particular characteristics which can only be obtained from the additional impurities or combination thereof may be produced. Also, epitaxial deposition may be readily performed so that regions having selected conductivity gradients and uncompensated impurity concentrations can be produced.

Figure 2:
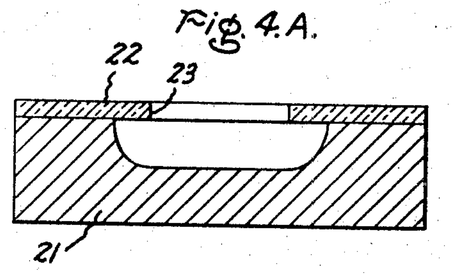
FIGURE 2 is a schematic illustration in vertical cross section of a device constructed in accord with the present invention.
Figure 2:
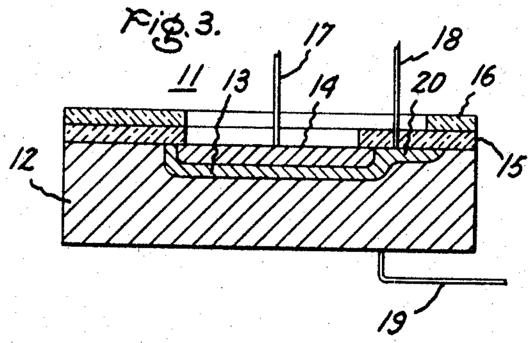

FIGURE 2 is a vertical cross-sectional view of a device 1 constructed in accord with the present invention which comprises a n-type region 2, constituting the main body of the wafer in which an impurity such as phosphorus has been incorporated during preparation, a p-type region 3 and an n-type region 4. The device also includes a silicon carbide layer 5 overlying the planar surface which has been produced, as previously described, on the regions from which an initial oxide layer has been removed. P-type region 3 has been produced by diffusing an impurity such as gallium into the wafer through the opening in the carbide layer 5. For masking the diffusion of phosphorus which produces region 4, an oxide layer 6 is provided, for example by deposition. Alternatively, a reverse electrical configuration could be prepared by using boron in the wafer to produce p-type conductivity in region 2, diffusing arsenic through the region not covered by silicon carbide layer 5 to provide n-type conductivity in region 3 and diffusing boron through the oxide layer 6 to produce a p-type region 4.

The device illustrated in FIGURE 2 is then provided with electrodes 7, 8 and 9 attached to the various regions and the device may be passivated completely by producing a layer of silicon carbide 10 over all of the remaining exposed silicon or, as illustrated, deposited over the entire surface.

The additional impurities which may be selected also allow the cost of the manufacturing process to be reduced by using simultaneous diffusions wherein the differing diffusion rates of the impurities to produce a multi-junction device. For example, by heating a wafer of n-type conductivity masked with SiC and $SiO_2$ in an atmosphere containing gallium and phosphorus for 2 hours at 1,100° C., an n-p-n transistor may be fabricated. The gallium diffuses at a higher rate and goes to a depth of 3.0 microns while the phosphorus diffuses to a depth of 2.5 microns. By providing an excess of phosphorus in the atmosphere, it is more highly concentrated in the shallow region and produces a region of n-type conductivity.

Figure 3:
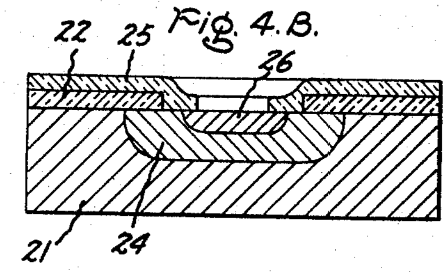
FIGURE 3 is a schematic illustration in vertical cross section of an alternative device in accord with this invention.

FIGURE 3 schematically illustrates a device produced by the process just described. As shown, the device 11 comprises a wafer 12 of n-type conductivity which is doped with phosphorus as an impurity. Regions 13 and 14 contain, respectively, gallium and phosphorus as dominant impurities introduced through the opening in the overlying layer of silicon oxide 15 and silicon carbide 16 to provide, respectively, p and n-type conductivity. The silicon carbide layer 16 masks the gallium while the oxide 15 masks the phosphorus. Finally, electrodes 17, 18 and 19 are attached to the respective layers through suitable openings formed in the oxide and carbide layers. Since the gallium diffusion is only slightly greater than the phosphorus, an area 20 may be provided extending the region 13 at the surface to allow room for electrode contact. The elimination of a heating step significantly reduces the cost of the manufacturing process. It is noted that the depth of diffusion of an impurity and the relative thickness of the respective regions may be adjusted by changing the relative temperatures or the times of exposure of the wafer to the respective impurities.

FIGURES 4A and 4B illustrate an alternative embodiment of this invention wherein the advantages of diffused-junction devices are combined with those of epitaxial deposition. In FIGURE 4A, a wafer 21 of silicon of predetermined conductivity type has been provided with a layer 22 of silicon carbide, the layer having an opening at 23. The silicon exposed beneath the opening 23 has been removed to a suitable depth to allow for introduction of an epitaxial layer. It is preferred that the method of epitaxial deposition used be the iodine transport process described and claimed in the co-pending application of Dash et al., Ser. No. 278,787, filed May 7, 1963, assigned to the assignee of the present invention, since this process is particularly rapid and results in the production of a highly uniform epitaxial layer. It is noted that this process often requires temperatures on the order of 1,300° C., and therefore the oxide mask previously used in planar technology is not adequate since it cannot withstand such temperatures.

FIGURE 4B illustrates the device after the epitaxial layer 24 has been deposited. An oxide layer 25 has also been provided and a region 26 has been diffused through an opening in the oxide. By providing the diffused region 26 within the epitaxial region 24, a two-junction transistor is produced. This device is to be distinguished from the conventional planar transistor which includes two diffused regions. First, since the epitaxial region includes only the impurity content of the source, the conductivity determining impurity is not compensated, thus avoiding the difficulty of achieving a desired type of conductivity in the presence of a compensating impurity. Second, since the impurity introduced into the epitaxial region can by constantly controlled and changed, for example, by controlling the content of the source, the gradient in the epitaxial region can be selected as desired. Thus, it is not limited to the constantly increasing gradient which is usually produced in diffused regions. Also, since the epitaxial region 24 is uncompensated, the diffused region 26 can be less heavily doped, thus enabling a wider selection of the parameters of the resulting device. Of course, both of the regions 24 and 26 may be produced by epitaxial deposition if desired. Also, the deposition may be carried out so as to produce a region extending above the surface of the wafer in some cases.

In this description and the appended claims, the terms "planar" and "substantially planar" have been used to describe devices produced by performing operations such as diffusing or epitaxially depositing on selected regions of generally flat surfaces of semi-conductive wafers. It is noted, in fact, the various operations of providing and removing oxides and carbides and of removing or depositing additional material actually may change the initially smooth surface to a depth of several microns. However, this variation is very small in comparison to the overall size of the device and therefore, the term "planar" is used in the art to describe such devices. It is also noted that, in particular types of multi-junction devices, diffusions or depositions may actually be made at both the top and bottom surfaces of a wafer. Such devices are also within the contemplation of the present invention.

The silicon carbide provided in accord with this invention preferably has the structure known as the beta form, this being a harder material and formed at a lower temperature. The alpha form may also be used if desired.

The following examples are set forth to exemplify the practice of this invention. These examples include specific values of the parameters involved so that the invention may be practiced by those skilled in the art. It is noted however, that these examples are provided for purposes of illustration only and are not to be construed in a limiting sense.

EXAMPLE 1

A semiconductor device is prepared in accordance with the present invention by providing a wafer of monocrystalline silicon doped with phosphorus at a concentration of $10^{16}$ atoms/cc. to provide n-type conductivity and having at least one substantially planar surface. The crystal is placed in a cylindrical quartz tube which is then inserted into a heating coil. This arrangement is hereinafter referred to as a furnace. A flow of dry oxygen is established through the furnace and a temperature of 1,000° C. is maintained for 2 hours. At the end of that time, the wafer is removed from the furnace and a layer of silicon dioxide approximately 1,000 angstrom units thick is found on the silicon.

The planar surface is masked and etched in accord with a predetermined pattern by well known techniques of photoengraving, for example as described in the publication "Photosensitive Resist for Industry," published by Eastman Kodak Company, 1962. The masking and etching is done in such a manner as to remove the oxide from those areas of the surface where diffusion is not to be permitted. Next, the wafer is placed in the furnace and heated to a temperature of 1,000° C. in an atmosphere of carbon monoxide for 5 minutes. Upon removal from the furnace, the wafer is found to have a layer of silicon carbide 0.5 micron thick on all regions from which the oxide has been removed. Next, the remaining oxide is removed by etching in hydrofluoric acid.

The wafer is now heated in an atmosphere containing gallium. The temperature maintained is 1,100° C. and the wafer is heated for 2 hours. This produces a region doped with gallium to a concentration of $10^{19}$ atoms/cc. This region is therefore converted to p-type conductivity. The region is approximately 3 microns deep and bounded by a p–n junction which emerges at the silicon-silicon carbide interface. Electrodes are now attached to the respective regions by conventional means such as exposing the silicon and depositing metal contacts through a suitable mask.

EXAMPLE 2

A semiconductor device is prepared in accord with the method stated in Example 1 except that the initial wafer is doped with boron at a concentration of $10^{18}$ atoms/cc. to provide p-type conductivity and the diffusion is carried out in an atmosphere containing arsenic at a temperature of 1,100° C. for 4 hours. The resulting n-type region within the silicon is 1 micron deep and the concentration of arsenic is $10^{21}$ atoms/cc.

EXAMPLE 3

A planar transistor is prepared in accord with this invention by providing a monocrystalline silicon wafer containing $10^{16}$ atoms/cc. of boron to provide p-type conductivity and having a substantially planar surface. The silicon wafer is placed in a furnace and a flow of dry oxygen is established at a temperature of 1,000° C. for 12 hours. At the end of this time, a layer of silicon dioxide having a thickness of approximately 0.8 micron overlies the planar surface. The surface is masked and etched in accord with a predetermined pattern by photolithographic techniques to provide at least one opening through the oxide at a location where a device is to be pprepared. A flow of oxygen is established in a furnace, the flow being from a source of phosphorus pentoxide to the silicon wafer, the source being at a temperature of 700° C. and the wafer being at a temperature of 1,100° C. This flow is maintained for ½ hour, after which the flow is stopped and the temperature is maintained for 1 hour, resulting in the formation of a 2 micron deep region of n-type conductivity silicon having a phosphorus concentration of $10^{19}$ atoms/cc. underlying the opening through the silicon dioxide layer. A layer of newly formed oxide covers the opening, the thickness being approximately 0.4 micron. The planar surface is again masked and etched so as to remove all of the oxide except for a portion within the previous opening where the next diffusion is to be permitted. The wafer is heated in a carbon containing atmosphere as described in Example 1 to produce a layer of silicon carbide over all regions of the device except where the portion of the oxide layer was left. The remaining oxide is then removed. The atmosphere is then changed to one containing gallium and the wafer is maintained at a temperature of 1,100° C. for 13 minutes. At the end of this time, a region of the silicon underlying each oxide area is reconverted to p-type conductivity due to a concentration of $10^{21}$ atoms/cc. of the gallium doping being about 1 micron. Electrodes are attached as previously described and the resulting device comprises a p-n-p transistor.

EXAMPLE 4

A semiconductive device is prepared by providing a wafer of n-type conductivity of silicon, providing an oxide layer on a surface as described in Example 1 and depositing a layer of silicon carbide over the oxide by placing the wafer in a furnace and reacting silane with toluene at a temperature of 1,000° C. An opening is provided through the carbide and oxide layers. The opening in the carbide layer is extended over the oxide by removing both layers to the extent desired for the carbide, regrowing a new oxide and removing a smaller portion of the oxide. The wafer is then placed in a furnace containing an atmosphere including gallium and phosphorus. The wafer is maintained at a temperature of 1,100° C. for 2 hours. At the end of this time, the gallium is diffused into a region underlying the opening in the carbide and the phosphorus is diffused into a region underlying an opening in the oxide. The depth of gallium diffusion is 3 microns and the depth of phosphorus diffusion is 2.5 microns. Electrodes are attached to the respective regions, that for the p-type gallium diffused region being provided at the extended region produced by extending the opening in the carbide. The resultant device comprises an n-p-n transistor.

EXAMPLE 5

A semiconductive device is prepared by providing a wafer of monocrystalline n-type silicon. A silicon carbide mask over selected surface regions is provided as described in Example 1 and the wafer is then etched in a mixture of nitric acid and hydrofluoric acid to remove 3 microns of silicon from the wafer at the exposed regions. The wafer is then placed in a furnace and juxtaposed with a source of p-type silicon. An atmosphere of iodine is provided and the source and substrate are heated to temperatures of 1,250° C. and 1,350° C., respectively. After a time of 3 minutes, the process is stopped and the removed silicon is found to have been replaced by an epitaxial layer of p-type silicon. The wafer is then covered with an oxide of silicon and a portion of the oxide overlying the epitaxial layer is removed. Phosphorus diffusion through the opening in the oxide is carried out as described in Example 3 to convert a portion of the epitaxial region to n-type conductivity. Electrodes are attached to the diffused n-type region, the epitaxial p-type region and the n-type wafer. The resultant device comprises an n-p-n transistor.

While we have shown and described several embodiments of our invention, it will be apparent to those skilled in the art that many changes and modifications may be made without departing from our invention in its broader aspects.

What we claim as new and desire to secure by Letters Patent of the United States is:

1. A method of producing a semiconductive device comprising the steps of:

providing a monocrystalline silicon wafer of predetermined conductivity;

forming a layer of silicon carbide over selected areas of a surface of said wafer, said layer being effective to mask said selected areas;

establishing an atmosphere containing an element capable of producing a different conductivity in silicon; and heating said wafer in said atmosphere to diffuse said element into said wafer only at surface regions not covered by said silicon carbide to convert a region of said silicon to a different conductivity.

2. A method as claimed in claim 1 and comprising the additional steps of:

masking portions of the surface of said areas not covered by silicon carbide with a non-conducting layer; and providing a region of conductivity different from that of said diffused region adjacent the surface areas not covered by said non-conducting layer.

3. A method as claimed in claim 1 wherein said silicon carbide is formed by heating said wafer in an atmosphere containing a compound including carbon.

4. A method as claimed in claim 3 wherein said wafer is maintained at an elevated temperature from prior to the formation of said silicon carbide until after the diffusion of said element.

5. A method as claimed in claim 1 wherein said region of said silicon of different conductivity is provided by epitaxially depositing from a source a layer of silicon of opposite conductivity on the surface regions not covered by said silicon carbide layer.

6. A method as claimed in claim 5 wherein the impurity content of said source is varied during said epitaxial deposition to produce a corresponding variation in the conductivity of said surface-adjacent region.

7. A method as claimed in claim 5 wherein an atmosphere including iodine is provided for performing said epitaxial deposition.

8. A method as claimed in claim 5 and including the step of removing a region of silicon from the areas not covered by said silicon carbide and carrying out said epitaxial deposition so as to replace the silicon removed.

9. A method as claimed in claim 5 wherein said epitaxial deposition is carried out so as to form an extension of said wafer.

10. A method as claimed in claim 5 and comprising the additional steps of:

covering a portion of the surface of said epitaxially deposited region; and providing a further region of conductivity different from that of said epitaxially deposited region adjacent the surface thereof.

11. A method as claimed in claim 5 wherein said wafer is maintained at a high temperature between the formation of said silicon carbide layer and said step of epitaxial deposition.

12. A method as claimed in claim 1 wherein said surface adjacent region of differing conductivity is provided by:

establishing an atmosphere containing at least two different conductivity-determining elements having unequal diffusion rates in silicon; and heating said wafer in said atmosphere to diffuse said elements into said wafer through the uncovered surface areas of said silicon wafer, said elements being diffused to different depths so as to create a multijunction device in said wafer.

References Cited

UNITED STATES PATENTS

| | | | |
|---|---|---|---|
| 3,157,541 | 11/1964 | Heywang et al. | 117—106 XR |
| 3,183,129 | 5/1965 | Tripp | 148—187 XR |
| 3,342,650 | 9/1967 | Seki et al. | 148—187 |
| 3,347,719 | 10/1967 | Heywang | 148—187 |
| 3,389,022 | 6/1968 | Kravitz | 148—175 XR |
| 3,397,448 | 8/1968 | Tucker | 148—175 XR |

L. DEWAYNE RUTLEDGE, *Primary Examiner.*

F. WEINSTEIN, *Assistant Examiner.*

U.S. Cl. X.R.

117—5.5, 106, 107.2; 148—187; 156—17